United States Patent [19]

Yablonovitch et al.

[11] Patent Number: 4,843,037

[45] Date of Patent: Jun. 27, 1989

[54] PASSIVATION OF INDIUM GALLIUM ARSENIDE SURFACES

[75] Inventors: Eli Yablonovitch, Middletown Township, Monmouth County; Thomas J. Gmitter, Lakewood, both of N.J.

[73] Assignee: Bell Communications Research, Inc., Livingston, N.J.

[21] Appl. No.: 87,420

[22] Filed: Aug. 21, 1987

[51] Int. Cl.[4] .................................... H01L 21/465
[52] U.S. Cl. ..................... 437/235; 148/DIG. 24; 148/DIG. 61; 148/DIG. 118; 148/DIG. 119; 357/52; 437/12; 437/244; 437/939; 437/941; 437/946
[58] Field of Search ............... 148/DIG. 3, 17, 24, 148/60, 15, 118, 119, 127, 61, 33.3; 437/12, 235, 243, 244, 939, 941, 946; 357/52, 61

[56] References Cited

U.S. PATENT DOCUMENTS

| | | | |
|---|---|---|---|
| 3,261,730 | 7/1966 | Pell | 437/12 |
| 3,310,442 | 3/1967 | Winstel et al. | 437/12 |
| 3,347,719 | 10/1967 | Heywang | 437/12 |
| 3,480,474 | 11/1969 | Emeis et al. | 437/12 |
| 3,898,141 | 8/1975 | Ermanis et al. | 204/129.43 |
| 4,007,294 | 2/1977 | Woods et al. | 357/52 |
| 4,053,335 | 10/1977 | Hu | 437/12 |
| 4,320,178 | 3/1982 | Chemla et al. | 428/698 |
| 4,349,395 | 9/1982 | Toyokura et al. | 437/939 |
| 4,544,416 | 10/1985 | Meador et al. | 437/12 |
| 4,569,119 | 2/1986 | Terada et al. | 437/176 |
| 4,632,886 | 12/1986 | Teherani et al. | 428/698 |
| 4,661,166 | 4/1987 | Hirao | 437/941 |

FOREIGN PATENT DOCUMENTS

| | | | |
|---|---|---|---|
| 0076663 | 7/1978 | Japan | 437/941 |
| 0042859 | 3/1985 | Japan | 437/12 |

OTHER PUBLICATIONS

Howes et al., Gallium Arsenide Materials, Devices and Circuits, John Wiley & Sons, New York, N.Y., 1985, pp. 123-125, 131 & 147-149.

"Unusually Low Surface—Recombination Velocity on Silicon and Germanium Surfaces", Phys. Rev. Lett., E. Yablonovitch, D. L. Allara, C. C. Chang, T. Gmitter and T. B. Bright, Phys. Rev. Lett., vol. 57, No. 2, Jul. 14, 1986, pp. 249-252.

"Unpinned (100) GaAs Surfaces in Air Using Photochemistry", Appl. Phys. Lett., S. D. Offsey, J. M. Woodall, A. C. Warren, P. D. Kirchner, T. I. Chappell, and G. D. Pettit, vol. 48 (7), Feb. 17, 1986, pp. 475-477.

"Enhanced Photoelectrochemical Solar-Energy Conversion by Gallium Arsenide Surface Modification", Appl. Phys. Lett., B. A. Parkinson, A. Heller and B. Miller, vol. 33 (6), Sept. 15, 1978, pp. 521-523.

"Reduction of GaAs Surface Recombination Velocity by Chemical Treatment", Appl. Phys. Letter, R. J. Nelson, J. S. Williams, H. J. Leamy, B. Miller, H. C. Casen, Jr., B. A. Parkinson and A. Heller, vol. 36 (1), Jan. 1, 1980, pp. 76-79.

"Absence of Fermi Level Pinning at Metal-$In_xGa_{1-x}$-As(100) Interfaces", Appl. Phys. Lett., L. J. Brillson, M. L. Slade, R. E. Viturro, M. K. Kelly, N. Tache, G. Margaritondo, J. M. Woodall, P. D. Kirchner, G. D. Pettit and S. L. Wright, vol. 48 (21), May 26, 1986, pp. 1458-1460.

(List continued on next page.)

Primary Examiner—Brian E. Hearn
Assistant Examiner—William Bunch
Attorney, Agent, or Firm—James W. Falk

[57] ABSTRACT

A method of passivating the surface of an indium gallium arsenide substrate by cleaning the indium gallium arsenide substrate in an etching solution and depositing a sodium hydroxide film on the substrate. The step of depositing the sodium hydroxide film is preferably performed by spin-on of a sodium hydroxide solution, followed by drying or annealing. The resulting passivated surface exhibits superior surface recombination velocity characteristics compared to prior art passivation techniques, thereby making possible superior solid state device operating characteristics.

4 Claims, 1 Drawing Sheet

OTHER PUBLICATIONS

"Dramatic Enhancement in the Gain of a GaAs/AlGaAs Heterostructure Bipolar Transistor by Surface Chemical Passivation", *Appl. Phys. Lett.*, C. J. Sandroff, R. N. Nottenburg, J. C. Bischoff and R. Bhat, vol. 51, (1), July 6, 1987, pp. 33-35.

"Electrons and Holes in Semiconductors", Robert E. Krieger Publishing Company, Huntington, N.Y., William Shockley, 1976, pp. 318-328.

"Surface Quantum Wells", *Appl. Phys. Lett.*, R. M. Cohen, M. Kitamura and Z. M. Fang, vol. 50 (23), June 8, 1987, pp. 1675-1677.

"Minority Carrier Lifetime and Luminescence Efficiency of 1.3 $\mu$m InGaAsP—InP Double Heterostructure Layers", *IEEE Journal of Quantum Electronics*, C. H. Henry, B. F. Levine, R. A. Logan and C. G. Bethea, vol. QE-19, No. 6, June 1983, pp. 905-912.

"Vapor Levitation Epitaxy: System Design and Performance", *Journal of Crystal Growth*, H. M. Cox, S. G. Hummel and V. G. Keramidas, vol. 79 (1986), pp. 900-908.

PASSIVATION OF INDIUM GALLIUM ARSENIDE SURFACES

BACKGROUND OF THE INVENTION

1. Field of the Invention

This invention relates to the surface passivation of III-V type semiconductors and more particularly to the passivation of indium gallium arsenide

2. Description of the Prior Art

Gallium arsenide and other III-V type semiconductors are attractive candidate materials for the fabrication of high performance semiconductor components. Although such materials offer the promise of high operational speed, they generally suffer from having surfaces with poor electronic qualities. One parameter which characterizes surface quality is the surface recombination velocity ($S_o$). Silicon surfaces ($S_o \sim 100$ cm/s) can be passivated by the development of a thermal oxide layer. However, attempts to surface passivate the III-V type semiconductors ($S_o \sim 10^6$ cm/s for GaAs) have not been entirely successful. The native oxide layers which can be formed on III-V compounds exhibit significant charge trapping under bias stress and, therefore, these native oxides are relatively ineffective as the surface passivation agent. In the case of gallium arsenide, growth of a native oxide layer leads to the formation of extrinsic defects yielding a high surface state density. In addition, most native III-V oxides are susceptible to environmental attack, for example, by moisture and oxygen.

Known surface passivation methods for III-V compound semiconductors which are made typically of GaAs may be divided roughly into three types.

The first method utilizes deposited films such as $SiO_2$, $Si_3N_4$, $Al_2O_3$ and $P_2O_5$ which are known from their use as passivation films for the surface of silicon semiconductors. Such an approach has the drawback that the deposition temperature is relatively high. $SiO_2$ film is most frequently used in view of the extensive practical knowledge concerning the deposition of such films in planar silicon semiconductor devices. However, $SiO_2$ films tend to absorb Ga from the surface of a substrate made of GaAs or GaP, and as a result such layers have the tendency to damage the stoichiometry of the surface of the substrate, leading to a high density of surface states and a large $S_o$.

The second method is to form a native oxide film corresponding to a thermal oxidation film of silicon, in place of the deposited film suggested above. For example, the anodic oxidation method has the advantage that an insulating thin film can be formed at a markedly low temperature as compared with the deposition method and also with the thermal oxidation method, irrespective of the instances wherein a solution is used or a gas plasma is used. Conversely, however, this anodic oxidation method has the disadvantage that it is thermally unstable, and therefore, it has the drawback that the quality of the film will change substantially at a temperature below the temperature range adopted for thermal diffusion of impurities and post-ion implantation annealing. Furthermore, the interface between an anodic oxide film and a substrate made of GaAs or GaP tends to contain a number of defects, so that when this film is utilized as an insulating film of an IGFET (insulated-gate field effect transistor), there still cannot be obtained as yet a large value of surface mobility comparable with that within the bulk, and thus at the current technical stage, it is not possible for the anodic oxide film to fully display those advantages and features on applying it to the surface of GaAs and GaP substrates which are represented by high mobility as compared with a silicon substrate. In III-V semiconductors which essentially are binary compounds, a direct thermal oxidation of their surfaces has not yet produced any satisfactory results with respect to the quality of the film produced or to the state of interface. Such native oxide film has the further drawback that it is dissolved in acids such as HF, HCl, and $H_2SO_4$. Therefore, native oxide films inconveniently cannot be used in such manufacturing process as would comprise a number of steps.

The third approach is to perform chemical oxidation by the use of, for example, hot hydrogen peroxide solution. This method is entailed by limitation in the thickness of the oxide film which is formed, and accordingly the extent of application of this method is limited also.

The use of sulfides in connection with the passivation of semiconductor substrates is disclosed in two U.S. patents. U.S. Pat. No. 4,320,178 describes the use of an $A^{III}B^{V}$ sulfide for passivating an $A^{III}B^{V}$ semiconductor substrate, such as gallium arsenide. The sulfide is formed by a process of heating the substrate with sulfur or hydrogen sulfide.

U.S. Pat. No. 4,632,886 describes the use of an electrolyte solution of sulfide ions to provide a chemically passivation layer on mercury cadmium telluride semiconductor substrates. The description is limited to a discussion of that specific compound semiconductor, and the passivation layer is described as being mercury sulfide, cadmium sulfide, and tellurium sulfide.

U.S. patent application Ser. Nos. 021,667 and 021,668 assigned to Bell Communications Research, Inc., the assignee of the present application, describe the use of a sulfide film consisting of $Na_2S \cdot 9H_2o$ as a passivation layer on III-V semiconductor substrates. However, prior to the present invention there has not been a simple, easily implemented surface passivation technique for indium gallium arsenide specifically which has been shown to achieve a sufficiently low surface recombination velocity for practical device applications.

REFERENCES

1. "Unusually Low Surface Recombination Velocity on Silicon and Germanium Surfaces", E. Yablonovitch, D. L. Allara, C. C. Chang, T. Gmitter and T. B. Bright, Phys. Rev. Lett. 57, 249 (1986).
2. "Unpinned (100) GaAs Surfaces in Air Using Photochemistry", S. D. Offsey, J. M. Woodall, A. C. Warren, P. D. Kirchner, T. I. Chappell and G. D. Pettit, Appl. Phys.Lett. 48, 475 (1986).
3. "Enhanced Photoelectrochemical Solar-energy Conversion by Gallium Arsenide Surface Modification", B. A. Parkinson, A. Heller, and B. Miller, Appl. Phys. Lett. 33, 521 (1978).
4. "Reduction of GaAs Surface Recombination Velocity by Chemical Treatment", R. J. Nelson, J. S. Williams, H. J. Leamy, B. I. Miller, H. C. Casey Jr., B. A. Parkinson and A. Heller, Appl. Phys. Lett. 38, 76 (1980).
5. "Absence of Fermi Level Pinning at Metal-$In_xGa_{1-x}As$ (100) Interfaces", L. J. Brillson, M. L. Slade, R. E. Viturro, M. K. Kelly, N. Tache, G. Margaritondo, J. M. Woodall, P. D. Kirchner, G. D. Pettit and S. L. Wright, Appl. Phys. Lett 48, 1458 (1986).

6. "Quantitative Comparison of Fermi Level Pinning at GaAs/Metal and GaAs/Liquid Junctions", G. Horowitz, P. Allongue, and H. Cachet, J. Electrochem. Soc. 131, 2563 (1984).
7. "Nearly Ideal Electronic Properties of Sulfide Coated GaAs Surfaces", E. Yablonovitch, C. J. Sandroff, R. Bhat, and T. Gmitter, Appl. Phys. Lett. 51, 439 (1987).
8. "Dramatic Enhancement of Gain of a GaAs/AlGaAs Heterostructure Bipolar Transistor by Surface Chemical Passivation", C. J. Sandroff, R. N. Nottenburg, J.-C. Bischoff and R. Bhat, App. Phys. Lett 51, 33 (1987).
9. "Low Temperature Photoluminescence From InGaAs/InP Quantum Wires and Boxes", H. Temkin, G. J. Dolan, M. B. Panish and S. N. G. Chu, Appl. Phys. Lett. 50, 413 (1987).
10. "Surface Quantum Wells", R. M. Cohen, M. Kitamura and Z. M. Fang, Appl. Phys. Lett. 50, 1675 (1987).
11. W. Shockley, "Electrons and Holes in Semiconductors", (van Nostrand, New York 1950) see p. 318.
12. "Minority Carrer Lifetime and Luminescence Efficiency of 1.3 $\mu$m InGaAsP-InP Double Heterostructure Layers", C. H. Henry, B. F. Levine, R. A. Logan and C. G. Bethea, IEEE J. of Q. Elec. QE-19, 905 (1983).
13. "Vapour Levitation Epitaxy: System Design and Performance", H. M. Cox, S. G. Hummel and V. G. Keramidas, J. of Crys. Growth 79, 900 (1986).

SUMMARY OF THE INVENTION

Briefly, and in general terms, the invention provides a method of passivating the surface of an indium gallium arsenide semiconductor substrate by depositing a sodium hydroxide (NaOH) film on the entire substrate or on the portion of the substrate to be passivated. More particularly, the present invention consists of spin or dip coating a sodium hydroxide film on the surface of an indium gallium arsenide substrate for passivation of such surface for electronic, optical, or electro-optical device applications.

The present invention also provides an article of manufacture consisting of an indium gallium arsenide semiconductor substrate and a layer of a sodium hydroxide on the substrate which functions to passivate the surface thereof for device applications.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
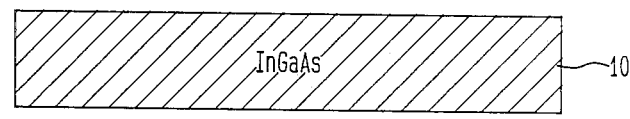
FIG. 1 is a highly simplified cross-sectional view of an indium gallium arsenide substrate.

Referring to FIG. 1, there is shown a cross-sectional view of a substrate on which is to be formed active semiconductor devices or a composite of layered materials useful in implementing solid state electronic, optical, or electro-optical devices or structures. The substrate 10 may be of any suitable material, such as a semiconductor material or insulating substrate, and may be selected depending upon the specific solid state device to be implemented or the particular fabrication process employed. For purposes of this description, the substrate 10 is assumed to be indium gallium arsenide, either bulk indium gallium arsenide or an indium gallium arsenide compound on another substrate, such as silicon or sapphire. The indium gallium arsenide substrate may be of any suitable thickness, but is preferably about 15 mils for most integrated circuit applications.

The passivation treatment according to the present invention consists of two steps.

First, the substrate 10 is subjected to a cleaning step which is a gentle etch preferably consisting of $H_2SO_4$:$H_2O_2$:$H_2O$ in the proportions 1:8:500.

Figure 2:
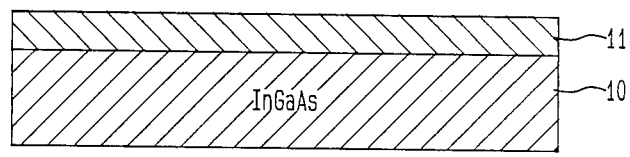
FIG. 2 is a highly simplified view of a sodium hydroxide passivation layer on the substrate formed according to the present invention.

Second, a passivation step which consists of spin or dip coating a sodium hydroxide film 11 on the surface of the substrate as shown in FIG. 2.

The process of film coating takes place by depositing a 1 M aqueous solution of NaOH by spinning at 5000 RPM for 60 seconds. Such procedure leaves a colorless, crystalline film 11 whose thickness is a function of the NaOH concentration. In order to achieve a film thickness of some 0.5 microns, which is preferred for most applications, a concentration of 0.5 to 1.0 Molar is appropriate. In addition to spin coating, roller coating or similar applications of the aqueous solution may be used as well.

The present invention is not limited to the use of a sodium hydroxide solution since other hydroxides such as potassium hydroxide (KOH) may be used as well.

Following the application of the solution, the substrate may be dried in air or annealed in a heated atmosphere to form a permanent film layer on the surface of the substrate.

There has been tremendous success recently in the use of chemical methods to create nearly ideal electronic surfaces on semiconductors. The lowest known surface recombination velocity (SRV) for any semiconductor, 0.25 cm/sec, is on chemically (see Reference 1) prepared Si<111>. Nevertheless, the interest in III-V surfaces has been much more intense (see References 2-6). In a broad survey of various chemical treatments for the III-V semiconductors, it has been discovered (see Reference 7) that $Na_2S \cdot 9H_2O$ produced a surface on GaAs whose electronic quality began to approach that of the AlGaAs/GaAs interface. This improvement in surface electronic quality led to the observation (see Reference 8) of a sixty-fold increase in the gain of GaAs heterojunction bipolar transistors.

By employing contactless photoconductivity decay, such as described in Reference 7, consideration is directed to $In_{0.53}Ga_{0.47}As$ (called herein indium gallium arsenide) which is a very important semiconductor in the field of photonics. The indium based semiconductors seem to share the property of having fairly reasonable surface electronic quality. Under a native oxide, we find that the SRV at room temperature is only ~5000 cm/sec. Moreover, at liquid helium temperatures the surface recombination processes appear to be completely frozen out (see References 9 and 10), permitting efficient luminescence. It is clear then that any further improvement in the quality of the $In_{0.53}Ga_{0.47}As$ surface would make it competitive with even the best lattice matched heterostructures such as $In_{0.53}Ga_{0.47}As$-

/InP. The present invention provides that a hydroxide (NaOH, KOH, etc.) chemical coating results in the best (lowest) SRV of any of the reagents tested in our search. The SRV of ~200 cm/sec is the lowest ever reported on any III-V semiconductor including sulfide coated GaAs reported in Reference 7.

To dramatize the excellent electronic quality of such chemically synthesized surfaces we have measured the quantum shifts in the photoluminescence spectra of "naked" quantum wells, i.e. quantum wells in which one face has been uncovered. Accessibility of one face of the quantum well permitted us to gradually etch down the well thickness from about ~50Å to about ~15Å, monitoring the quantum shift along the way.

A particularly versatile new probe of SRV is the contactless laser-pumped pumped carrier lifetime bridge (see Reference 7). This inductively coupled radio frequency apparatus monitors the absolute sheet conductivity of the semiconductor as a function of time. A short pulse of incoherent light from a Q-switched Nd-Yag laser scattering off a white surface, injects electrons and holes into an InP/In$_{0.53}$Ga$_{47}$As/InP double heterostructure epilayer. The recombination of electrons with holes is monitored by the decay of the conductivity associated with the optically injected carriers. If the epilayer thickness L is sufficiently small, the decay of excess carrier density n is simply the sum of a bulk and a surface term (see Reference 7):

$$\frac{dn}{dt} = -\left[\frac{1}{\tau_b} + \frac{S + S_h}{L}\right]n \quad (1)$$

where $\tau_b$ is the bulk recombination lifetime, S is the SRV of the front surface which is accessible for chemical modification and $S_h$ is the SRV of the rear In$_{0.53}$Ga$_{0.47}$As/InP heterostructure interface. The reciprocal of the quantity in brackets in eq. (1) was called by Shockley (see Reference 11) the "filament lifetime" $\tau$, which in general may depend on n. Irrespective of the absorption depth of the light source, the injected carrier density n will become spatially uniform and eq. (1) will be valid provided that $L << \sqrt{D\tau}$ where D is the ambipolar diffusion constant and $\sqrt{D\tau}$ is the diffusion length.

Measurements of the density decay curve of an intact undoped 0.65 μm thick InP/In$_{0.53}$Ga$_{0.47}$As/InP double heterostructure epilayer have been made. Then the upper InP layer was selectively etched away exposing the free In$_{0.53}$Ga$_{0.47}$As surface. Following any interfacial chemical treatment the density decay was measured again on exactly the same sample. The density decay curves for the original intact double heterostructure and a number of chemical preparations have been measured. The initial non-exponential character of the double heterostructure decay curve is due to the influence of bulk Auger and radiative recombination. By employing the intact double heterostructure decay curve as a reference we can subtract out the effect of bulk recombination leaving only the difference in SRV between the InP/In$_{0.53}$Ga$_{0.47}$As interface and the chemically modified surface as the measured quantity. Specifically the logarithmic derivative $(1/n)(dn/dt)$ of the density decay curve is the reciprocal filament lifetime $1/\tau$. At a given density, the difference in reciprocal filament lifetime between the chemically prepared surface and the reference InP/In$_{0.53}$Ga$_{0.47}$As interface is $(S-S_h)/L$.

Likewise, we can thin down the sample chemically and plot the reciprocal filament lifetime versus reciprocal thickness L as is frequently done (see Reference 2) in studies of SRV. As seen from eq. (1) the slope of the resulting line is simply $S + S_h$. Combining the sum and difference expressions we can then determine S and $S_h$ separately.

One can compare the decay curves resulting from a number of different surface preparations with that obtained for the InP/In$_{0.53}$Ga$_{0.47}$As heterostructure. A careful analysis of the shapes of the decay curves led to the conclusion that there was negligible surface charge present to bend the bands, which should be compared to the small amount that was indeed detected for sodium sulfide coated GaAs. The sum and difference measurements of SRV led to $S \approx 150$ cm/sec and $S_h \approx 45$ cm/sec for one case. The dry NaOH film in another case had $S \approx 250$ cm/sec. The value for $H_h$ resembles previous (see Reference 12) measurement on InGaAsP.

If we make the usual simplifying assumptions that $S = N_t v_{th} \sigma$ where $N_t$ is the surface density of recombination centers, $v_{th} \approx 10^7$ cm/sec is the carrier thermal velocity, and $\sigma \sim 10^{-15}$ cm$^2$ is the recombination cross-section, then the low S for the In$_{0.53}$Ga$_{0.47}$As surface coated with NaOH implies $N_t \sim 10^{10}$/cm$^2$. In other words there is only one electronically active surface defect out of every $10^5$ surface bonds.

In order to study the effect of the NaOH coating on quantum wells, a very thin and uniform layer of In$_{0.53}$Ga$_{0.47}$As was required. The epitaxial structure consisting of 50 Å of In$_{0.53}$Ga$_{0.47}$As on a 3000Å InP buffer layer, was grown by chloride vapor levitation epitaxy (see Reference 13) in a dual growth chamber system at 550° C. The substrate was Fe-doped semi-insulating InP oriented 3° off <100> toward the closest <110> axis. At this lower than usual growth temperature, a very low growth rate is possible. The 50Å In$_{0.53}$Ga$_{0.47}$As layer required 60 seconds growth time whereas the wafer was transferred from the InP growth chamber to the In$_{0.53}$Ga$_{0.47}$As growth chamber in less than one half second. This results in extremely sharp heterointerfaces even without interruption of growth between layers. Transmission electron microscopy confirmed approximately monolayer abruptness for an 11Å In$_{0.53}$Ga$_{0.47}$As/InP quantum well grown under the same conditions 15. Band-to-band room temperature photoluminescence was excited by a focused 0.63 μm, 5 mW, He-Ne laser, but the pump intensity was always kept below the threshold for nonlinear band filling effects which could have distorted the spectra. Due to the hygroscopic character of NaOH it was desirable to flow dry N$_2$ over the sample during the photo-excitation to prevent photo-etching.

The linewidth indicates reasonable uniformity of epilayer thickness and composition. Then the epilayer was thinned in a very dilute etchant, H$_2$SO$_4$:H$_2$O$_2$:H$_2$O (1:8:50,000) which was independently measured to have an etch rate of ~20Å per minute. At approximately 10 second intervals, the samples were removed from the etchant, rinsed, coated with NaOH, and a photoluminescence spectrum was recorded. The resulting series of spectra have been measured. There is a smooth quantum shift as a function of etch time. After 95 seconds of etching, the surface of the InP was almost bare except for a few small patches.

It is interesting to note that even at the outset, before etch-thinning, the electron and hole wave function is shared between the very thin In$_{0.53}$Ga$_{0.47}$As surface layer and the InP substrate. As the $In_{0.53}Ga_{0.47}As$ becomes thinner and thinner, the carriers have more and more of their probability amplitude in the InP, with the electrons eventually becoming unbound due to the shallowness of the electron potential well in this heterojunction. In effect, a miniscule amount of $In_{0.53}Ga_{0.47}As$ coating on an InP wafer confines a surface 2-d hole gas, which recombines radiatively with a 3-d electron gas.

The absolute luminescence efficiency could be measured by referencing the photoluminescence signals to elastically scattered light from a white surface illuminated by a 1.52 $\mu$m He-Ne laser in the identical optical system. As explained above, the surface preparation is a two-step process in which etch-cleaning is step (1). The NaOH film is ineffective without a preliminary etch-cleaning step. It has been found that 20 seconds of etch-cleaning were required for the full benefit from spin-coating the NaOH film. This corresponds to the removal of the top few atomic layers of $In_{0.53}Ga_{0.47}As$, in order to get the full twenty-fold increase in luminescence.

We turn now to some variations in the chemical preparation procedure. As explained above, it consisted of an etch-cleaning step, a 30-minute soak in 10M NaOH, followed by a spin coating. The 30-minute duration could be reduced to 5 minutes if it was preceded by a rinse in $(NH_4)_2S$. Furthermore, the presence of the pulsed Nd:Yag laser light during the lifetime decay measurements seemed to have a slightly beneficial effect, suggesting some photochemical action. The coated $In_{0.53}Ga_{0.47}As$ seems to be relatively durable, especially in a dry environment. After a few days the SRV climbed by a factor of 2, but then it remained essentially constant after four weeks of aging.

While the invention has been illustrated and described as embodied in a process for passivation of indium gallium arsenide semiconductor surfaces, it is not intended to be limited to the details shown since various modifications and structural changes may be made without departing in any way from the spirit of the present invention.

It will be obvious to those skilled in the art that the process according to the present invention can be implemented with various semiconductor technologies and different combinations of known process steps, and that the preferred embodiments illustrated here are merely exemplary. The thickness of the active and passivation layers, depth of penetration and gradation in concentration of various impurities in active layers and in particular the configuration and distance between the various layers, as well as the types of devices to which the process is applied can be chosen depending upon the desired properties. Thee and other variations can be further elaborated by those skilled in the art without departing from the scope of the present invention.

Without further analysis, the foregoing will so fully reveal the gist of the present invention that others can readily adapt it for various applications without omitting features that, from the standpoint of prior art, fairly constitutes essential characteristics of the generic or specific aspects of this invention, and, therefore, such adaptations should and are intended to be comprehended within the scope and range of equivalence of the following claims.

What is claimed is:

1. A method for passivating and attaining a low surface recombination velocity in an indium gallium arsenide surface, said method comprising the steps of
   cleaning an indium gallium arsenide surface,
   forming on said cleaned indium gallium arsenide surface a layer consisting of an hydroxide in an aqueous solution,
   and annealing said indium gallium arsenide surface so that said hydroxide forms a passivation layer on said indium gallium arsenide surface while attaining the low surface recombination velocity required for high-speed devices.

2. A method as in claim 1 wherein the hydroxide in said layer is selected from the group consisting of sodium hydroxide and potassium hydroxide.

3. A method of attaining a high-speed indium gallium arsenide device comprising the steps of
   cleaning an indium gallium arsenide substrate surface,
   depositing on said substrate surface a film consisting of an hydroxide in an aqueous solution,
   and solidifying the film to form a permanent layer on said substrate surface which passivates the surface of said indium gallium arsenide substrate and attains a low surface recombination velocity in the thus passivated surface.

4. A method as in claim 3 wherein the hydroxide in said film is selected from the group consisting of sodium hydroxide and potassium hydroxide.

* * * * *

UNITED STATES PATENT AND TRADEMARK OFFICE
CERTIFICATE OF CORRECTION

PATENT NO.  : 4,843,037

DATED       : June 27, 1989

INVENTOR(S) : Yablonovitch et al.

It is certified that error appears in the above-identified patent and that said Letters Patent is hereby corrected as shown below:

Column 2, line 34, "application" should read --applications--.
Column 5, line 16, "pumped pumped" should read --pumped--.
Column 5, line 22, "$Ga_{47}$" should read --$Ga_{0.47}$--.
Column 6, line 18, "$H_h$" should read --$S_h$--.
Column 8, line 6,  "Thee" should read --These--.

Signed and Sealed this

Fourteenth Day of July, 1992

Attest:

DOUGLAS B. COMER

Attesting Officer

Acting Commissioner of Patents and Trademarks